US008324924B2

(12) United States Patent  
Landoll

(10) Patent No.: US 8,324,924 B2
(45) Date of Patent: Dec. 4, 2012

(54) POST-PROGRAMMING FUNCTIONAL VERIFICATION FOR PROGRAMABLE INTEGRATED CIRCUITS

(76) Inventor: David Scott Landoll, Austin, TX (US)

( * ) Notice: Subject to any disclaimer, the term of this patent is extended or adjusted under 35 U.S.C. 154(b) by 0 days.

(21) Appl. No.: 12/908,841

(22) Filed: Oct. 20, 2010

(65) Prior Publication Data

US 2011/0148462 A1 Jun. 23, 2011

Related U.S. Application Data

(60) Provisional application No. 61/253,498, filed on Oct. 20, 2009.

(51) Int. Cl.
 *H03K 19/00* (2006.01)
 *H03K 19/173* (2006.01)
 *H01L 25/00* (2006.01)
 *G06F 9/455* (2006.01)
 *G06F 17/50* (2006.01)

(52) U.S. Cl. ............... 326/16; 326/38; 326/41; 326/47; 326/101; 716/111; 716/116

(58) Field of Classification Search .............. 326/37–47, 326/101, 16; 716/106, 108, 111, 113, 116
See application file for complete search history.

(56) References Cited

U.S. PATENT DOCUMENTS

| | | | | |
|---|---|---|---|---|
| 5,457,408 | A * | 10/1995 | Leung | 326/38 |
| 6,279,146 | B1* | 8/2001 | Evans et al. | 716/113 |
| 6,701,504 | B2* | 3/2004 | Chang et al. | 716/122 |
| 6,725,432 | B2* | 4/2004 | Chang et al. | 716/132 |
| 7,100,133 | B1* | 8/2006 | Meiyappan et al. | 716/102 |
| 7,284,159 | B2* | 10/2007 | Chakraborty et al. | 714/41 |
| 7,353,162 | B2* | 4/2008 | Huang et al. | 703/23 |
| 7,631,235 | B2* | 12/2009 | Plunkett | 714/727 |
| 2001/0042237 | A1* | 11/2001 | Chang et al. | 716/8 |
| 2002/0116168 | A1* | 8/2002 | Kim | 703/28 |
| 2002/0166098 | A1* | 11/2002 | Chang et al. | 716/1 |
| 2003/0115564 | A1* | 6/2003 | Chang et al. | 716/8 |
| 2004/0153301 | A1* | 8/2004 | Isaacs et al. | 703/14 |
| 2005/0050393 | A1* | 3/2005 | Chakraborty et al. | 714/30 |
| 2006/0184350 | A1* | 8/2006 | Huang et al. | 703/26 |
| 2008/0215942 | A1* | 9/2008 | Plunkett | 714/727 |
| 2008/0234952 | A1* | 9/2008 | Sasaki | 702/58 |

* cited by examiner

*Primary Examiner* — Thienvu Tran

(57) ABSTRACT

Techniques and technology are provided to enable the testing of a programmable integrated circuit from within the programmable integrated circuit itself. In various implementations of the invention, a hardware verification module is added to the programmable integrated circuit by the manufacturer. Once the programmable integrated circuit is programmed to have a desired functionality, the hardware verification module may be activated and used to apply tests and receive responses from the programmable integrated circuit to verify its functionality.

17 Claims, 7 Drawing Sheets

POST-PROGRAMMING FUNCTIONAL VERIFICATION FOR PROGRAMABLE INTEGRATED CIRCUITS

RELATED APPLICATION

This application claims priority under 35 U.S.C. §119(e) to U.S. Provisional Patent Application No. 61/253,498 entitled "Safety Critical Hardware Verification IP," filed on Oct. 20, 2009 and naming David Landoll as inventor, which application is incorporated entirely herein by reference.

FIELD OF THE INVENTION

The present invention is directed to electronic design automation. Particularly, various implementations of the invention are directed towards verifying the functionality of a programmable integrated circuit after the integrated circuit has been programmed.

BACKGROUND OF THE INVENTION

Electronic circuits, such as integrated circuits, are used in a variety of products, from automobiles to microwaves to personal computers. Some integrated circuits are designed and manufactured to have a specific set of features, or be used for a specific purpose. These types of integrated circuits are often referred to as application-specific integrated circuits (ASICs). Other types of integrated circuits are designed and manufactured to be customizable after the integrated circuit has been manufactured. These types of integrated circuits are often referred to as programmable integrated circuits.

Designing and customizing programmable integrated circuits involves many steps. Although these steps may often take place after the programmable integrated circuit has been manufactured, they are still typically thought of as the "design flow." Several steps are common to most design flows. Initially, the specification for a new programmable integrated circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit, i.e. that the logical design conforms to the specification.

Logical designs are often verified using a simulation of the logical design. As those of ordinary skill in the art will appreciate, a logical design may be simulated. Subsequently, inputs may be applied to the logical design and outputs may be received from the logical design, via the simulation. Specific tests, that is, a selected set of inputs, having a corresponding set of expected outputs, are typically applied to the logical design in order to ensure that the functionality of the logical design matches the functionality required by the design specification. The functionality described by the specification is often referred to as the "intended functionality."

The simulated outputs (i.e. those outputs resulting from applying the test inputs to the logical design during simulation) can then be compared to the expected outputs. Any discrepancies in the simulated outputs and the expected outputs may then be investigated by a designer and appropriate changes to the logical design made. This ensures that the logical design performs the intended functionality. This type of verification is occasionally referred to as "functional verification," as it seeks to verify the intended functionality of the logical design.

After the logical design is verified, it is converted (i.e. synthesized) into a programmable design. The programmable design will be used to configure the programmable integrated circuit, such that the intended functionality may be realized. As mentioned above, functional verification is often used to ensure that a logical design behaves as intended. However, this only ensures that the logical designs functionality matches the intended functionality. Functional verification does not ensure that errors will not be made during the process of synthesizing a programmable design from the logical design, or during the actual programming of the programmable integrated circuit.

In some industries, such as, for example, aviation, military, and aerospace, specific standards relating to verification exists. These types of standards are often referred to as "safety standards." Safety standards typically require that the same functional verification tests performed on the logical design also be performed on the programmable integrated circuit once it has been configured. Currently, this is accomplished through the use of custom testing hardware, onto which the programmable integrated circuit is mounted. The custom testing hardware, often referred to as a "test board," is then connected to a computer and the programmable integrated circuit is tested via the test board. However, these custom test boards are typically designed for a specific programmable integrated circuit. In extreme cases, a different test board will be required for each configuration of a programmable integrated circuit. Test boards often cost more than $30,000 each. In addition to the cost of each board, designing, creating, and maintaining a board requires additional resources that add to the cost and time required to design and bring to market a design using a programmable integrated circuit.

These additional costs and resource requirements can be especially burdensome in applications where only a relatively small number of integrated circuits will ever be manufactured from the design, such as, for example, integrated circuits manufactured for the aviation industry.

BRIEF SUMMARY OF THE INVENTION

Techniques and technology are provided to enable the testing of a programmable integrated circuit from within the programmable integrated circuit itself. In various implementations of the invention, a hardware verification module is added to the programmable integrated circuit by the manufacturer. Once the programmable integrated circuit is programmed to have a desired functionality, the hardware verification module may be activated and used to apply tests and receive responses from the programmable integrated circuit to verify its functionality.

In some implementations of the invention, the hardware verification module has its own input. The hardware verification module may be enabled, and correspondingly disabled, through this input. Enabling the hardware verification module isolates the programmable integrated circuit's normal input and output pins from the system within which it is placed. A computer may be connected to the hardware verification module input to control testing of the programmable integrated circuit. Tests then may be communicated to the hardware verification module, and applied to the programmable integrated circuit by the hardware verification module. Subsequently, responses of the programmable integrated circuit may be captured by the hardware verification module and communicated to the computer.

With some implementations of the invention, an integrated circuit testing system may be used to apply a set of tests to the programmable integrated circuit, through the hardware verification module. A set of tests that were used to verify a logical design corresponding to the programmable integrated circuit, such as, for example, through a simulation of the logical design, may be applied to the integrated circuit and then the results from applying the set of tests to the simulated logical design may be compared to the results from applying the set of tests to the actual integrated circuit.

These and additional aspects of the invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

Introduction

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Furthermore, in various implementations, a mathematical model may be employed to represent an electronic device. For example, a model describing the connectivity of the device, such as, a netlist, might be employed. Those of ordinary skill in the art will appreciate that the models, even mathematical models represent real world physical device designs and real world physical phenomenon corresponding to the operation of the device. Additionally, those of ordinary skill in the art will appreciate that during many electronic design and verification processes, the response of a device design to various signals or inputs is simulated. This simulated response corresponds to the actual physical response the device being modeled would have to these various signals or inputs.

Some of the methods described herein can be implemented by software stored on a computer readable storage medium, or executed on a computer. Accordingly, some of the disclosed methods may be implemented as part of a computer implemented electronic design automation ("EDA") tool. The selected methods could be executed on a single computer or a computer networked with another computer or computers.

Illustrative Computing Environment

Figure 1:
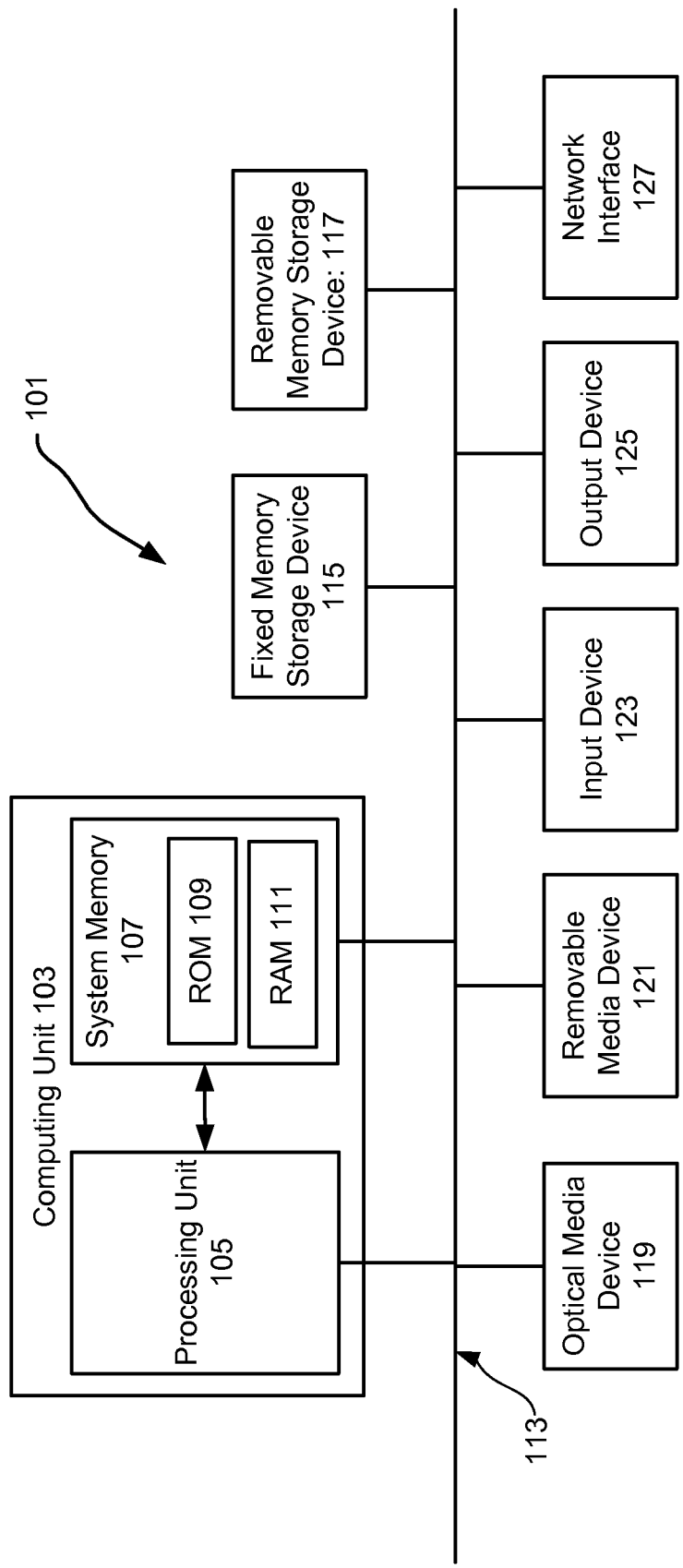
FIG. 1 shows an illustrative computing environment.

As various aspects of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Field Programmable Gate Array

As discussed above, programmable integrated circuits, such as, for example, field programmable gate arrays (FPGAs) are integrated circuits that may be configured after manufacturing to perform specific logic functions. Although the balance of this disclosure discusses various implementations of the invention in the context of FPGAs, implementations of the invention are applicable to other types of programmable integrated circuits, such as, for example, programmable logic devices (PLDs), programmable integrated circuits (PICs), field programmable analog arrays (FPAAs), configurable logic blocks (CLBs), or programmable read-only memory (PROM) devices.

Figure 2:
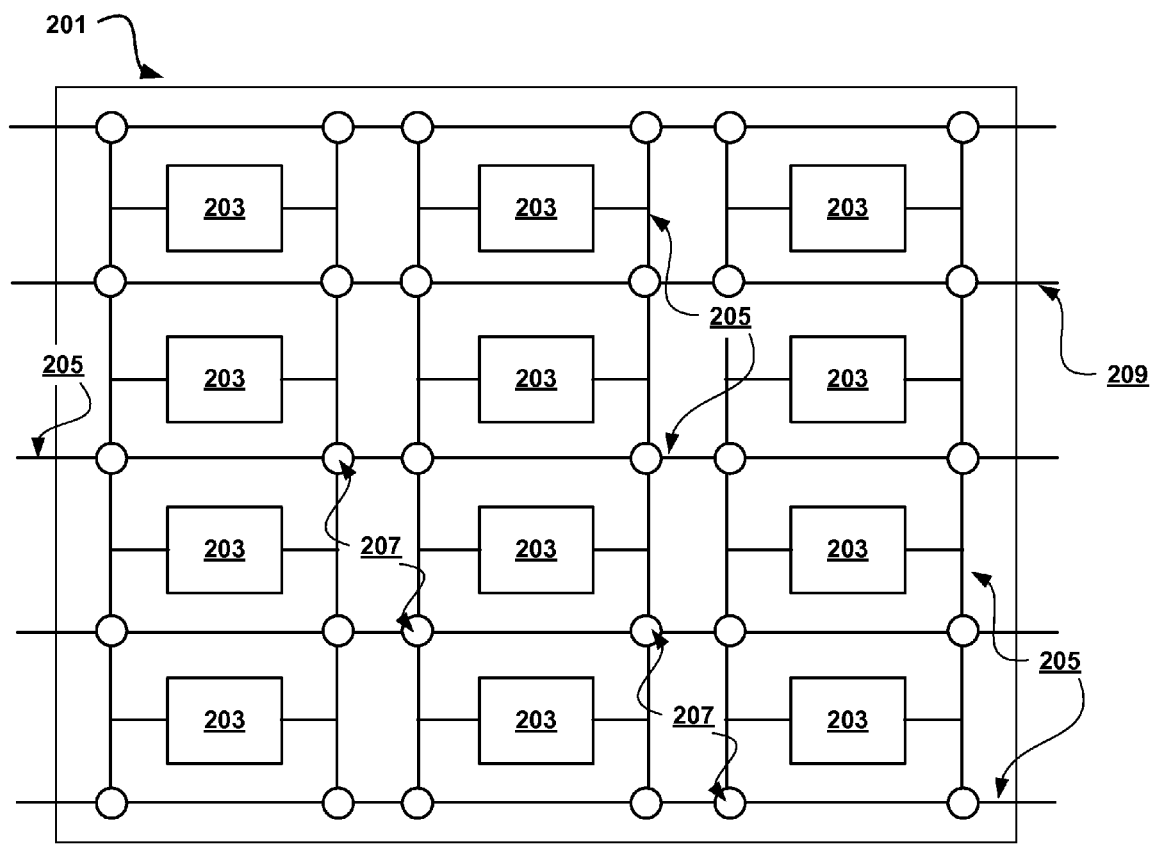
FIG. 2 shows an illustrative field programmable gate array.

FIG. 2 illustrates a field programmable gate array 201. As can be seen from this figure, the FPGA 201 includes a number of logic blocks 203, routing channels 205, and switch blocks 207. By enabling or disabling various switch blocks 207, electrical connections can be formed between selected logic blocks 203. Furthermore, as can be seen, some of the routing channels 205 extend outside the borders of the FPGA 201 at points 209. These routing channels act as input and output connections (i.e. pins) to the FPGA 201. Accordingly, by configuring the switch blocks 207, electrical connections can be formed between specific logic blocks 203, and also between specific logic blocks 203 and external connections 209.

As those of ordinary skill in the art will appreciate, the logic blocks 203 may include a number of different logical components, such as, for example, a flip-flop, and a lookup table. The logic blocks 203 may also include digital logic gates, such as, for example, an AND gate. Although the logic blocks 203 are shown in FIG. 2 as all being the same, many modern FPGAs have different types of logic blocks 203 within the same FPGA. For example, an FPGA could have logic blocks 203 that perform digital logic functions, and other logic blocks 203 that perform analog functions. Also, an FPGA could have logic blocks 203 that perform memory functions. More specifically, some logic blocks 203 may store information in a computer readable medium in a non transitory fashion. That is to say, the stored information is not solely a signal or a signal per se. Furthermore, modern FPGAs include millions of logic blocks 203 and often many more routing channels 205 than illustrated in FIG. 2. As a result, functional verification of a modern programmed FPGA is simply not economically feasible, or often possible, to do manually. Furthermore, due to the complexity of modern FPGAs, functional verification is that much more important, particularly in safety critical environments, such as, for example, avionics.

Field programmable gate arrays are discussed in greater detail in *Field Programmable Gate Arrays*, by H. Verma, IEEE Potentials, October/November 1999, vol. 18, is. 4, pp. 34-36, which article is incorporated entirely herein by reference. As those of ordinary skill in the art are familiar with field programmable gate arrays, various types of field programmable gate arrays and various techniques and technology for programming field programmable gate arrays, such techniques and technology are not discussed further herein.

Figure 3:
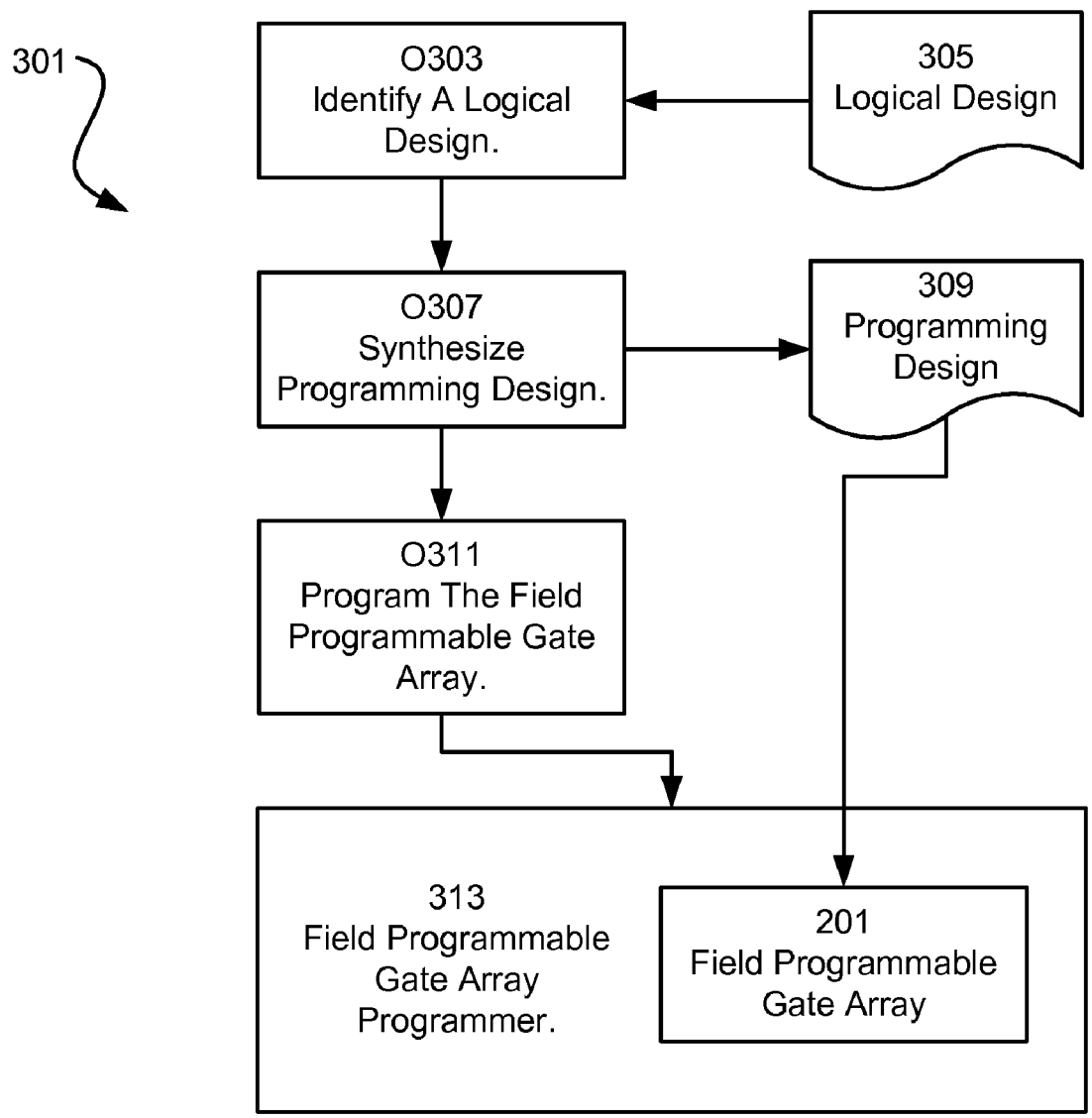
FIG. 3 shows a conventional method of programming a field programmable gate array.

FIG. 3 shows a conventional field programmable gate array programming method 301. As can be seen from this figure, the method 301 is used to program (i.e. configure the switch blocks 207) the field programmable gate array 201. The method 301 includes an operation 303 for receiving a logical design 305 for the field programmable gate array 201, an operation 307 for synthesizing a programming design 309 from the logical design 305, an operation 311 for programming the field programmable gate array 201 from the programming design 309. As can be seen, the field programmable gate array 201 is programmed via a field programmable gate array programmer 313. As those of skill in the art will appreciate, a field programmable gate array programmer 313 is typically a printed circuit board, onto which the field programmable gate array 201 can be mounted, and which is further connectable to a computing device, such as, the computing device 101 of FIG. 1. The programming design 309 is then transmitted to the field programmable gate array programmer 313 and the field programmable gate array programmer 313 facilitates configuring the switch blocks 207 within the field programmable gate array 201 as specified in the programming design 309.

Safety Critical Verification Standards

As described above, various standards exist that require electronic devices, such as, for example, programmable integrated circuits, to be tested in a specific manner in order for the electronic device to be used as specified in the standard. For example, the aviation industry in the United States is regulated by the Federal Aviation Administration (FAA). The FAA requires that aviation electronics projects meet the Design Assurance Guidelines for Airborne Electronic Hardware (referred to as "DO-254") standard. The DO-254 standard specifies what hardware vendors must do to have their hardware (i.e. programmable integrated circuits) certified to meet the standard. One such requirement is that the hardware be "back-end" tested. More specifically, the actual programmable integrated circuits must be tested, as opposed to testing a simulation of the circuit.

Figure 4:
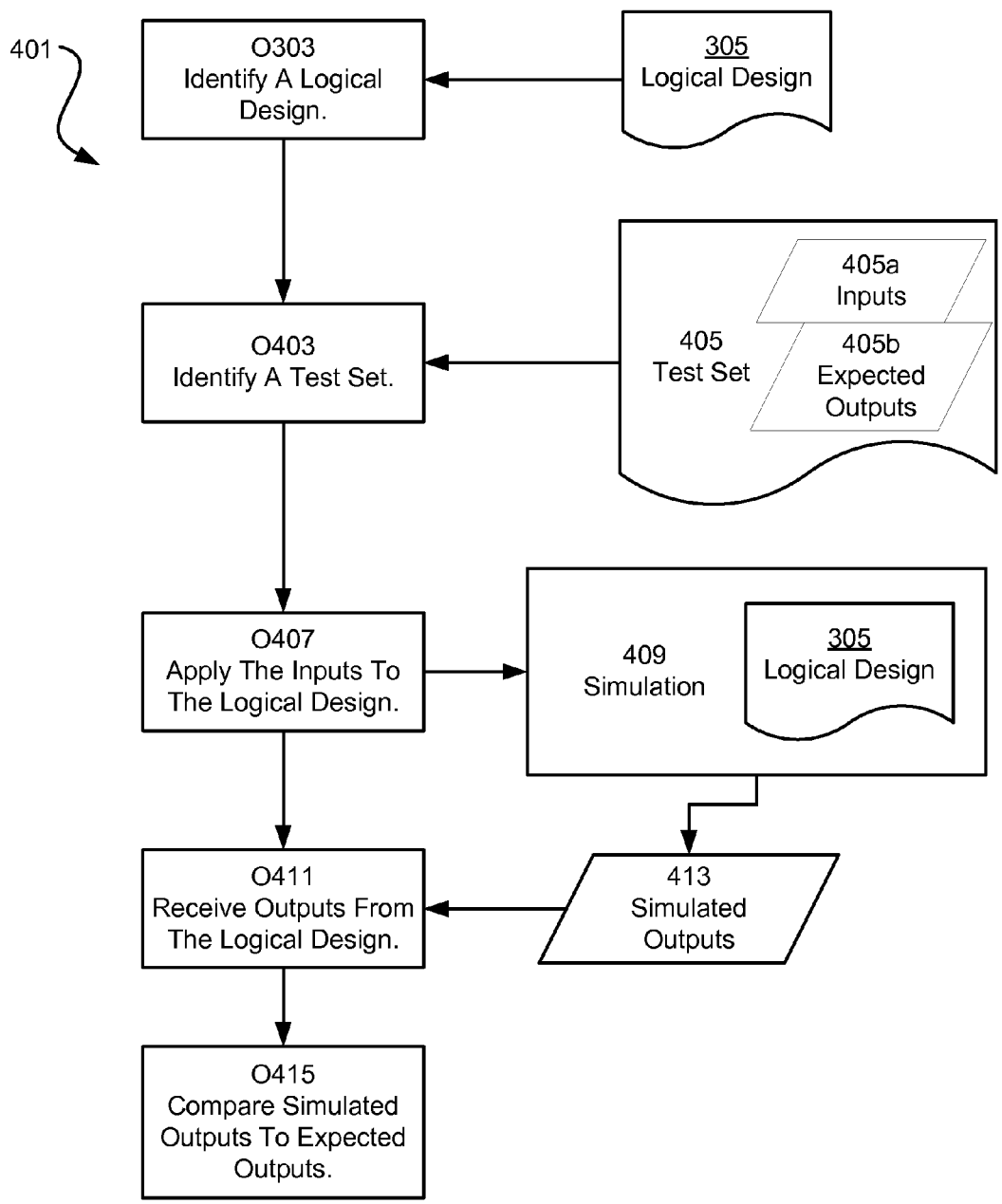
FIG. 4 shows a conventional method of functionally verifying a field programmable gate array.

As detailed above, logical designs are often functionally verified to ensure that the logical design's functionality matches the intended functionality. FIG. 4 illustrates a conventional field programmable gate array verification method. As shown, the method 401 includes the operation 303 for identifying the logical design 305 from the method 301 of FIG. 3. The method 401 further includes an operation 403 for identifying a test set 405. The test set 405 includes a set of inputs 405*a* and a set of expected outputs 405*b* corresponding to the set of inputs 405*a*. The method 401 further includes an operation 407 for applying the inputs 405*a* to the logical design 305. As can be seen, this is facilitated through a simulation 409 of the logical design 305. An operation 411 is provided for receiving the simulated outputs 413 from the simulation 409. As will be appreciated by those of ordinary skill in the art, the simulated outputs 413 are the results of applying the inputs 405*a* to the logical design 305 via the simulation 409. Additionally, an operation 415 for comparing the simulated outputs 413 to the expected outputs 405*b* is provided. As indicated above, any discrepancies between the outputs can be analyzed by a designer and appropriate changes to the logical design 305 may be made.

As shown, functional verification of field programmable gate arrays conventionally takes place prior to the logical design 305 being synthesized into a programmable design 309 and prior to the actual field programmable gate array 201 being programmed according to the programmable design 309. As a result, more tests are needed in order for field programmable gate arrays to meet the requirements of the DO-254 standard.

In addition to functional verification requirements, the DO-254 standard also requires that the results from all the design tools, such as, for example, the synthesis tools, the programming tools, and the simulation tools, be double checked. More specifically, the design tools must be analyzed to ensure that they are operating correctly.

Functionally Verifiable Field Programmable Gate Arrays

Figure 5:
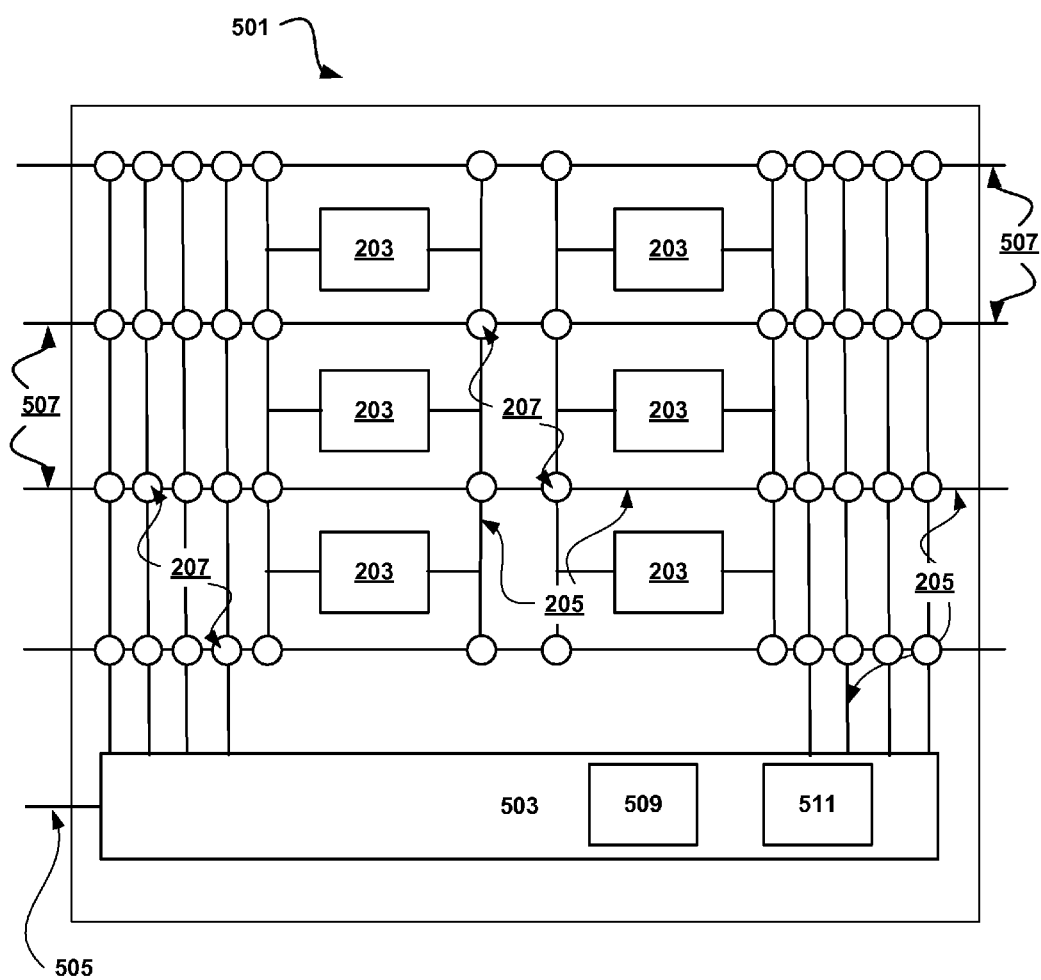
FIG. 5 illustrates a functionally verifiable field programmable gate array that may be provided by various implementations of the present invention.
Figure 6:
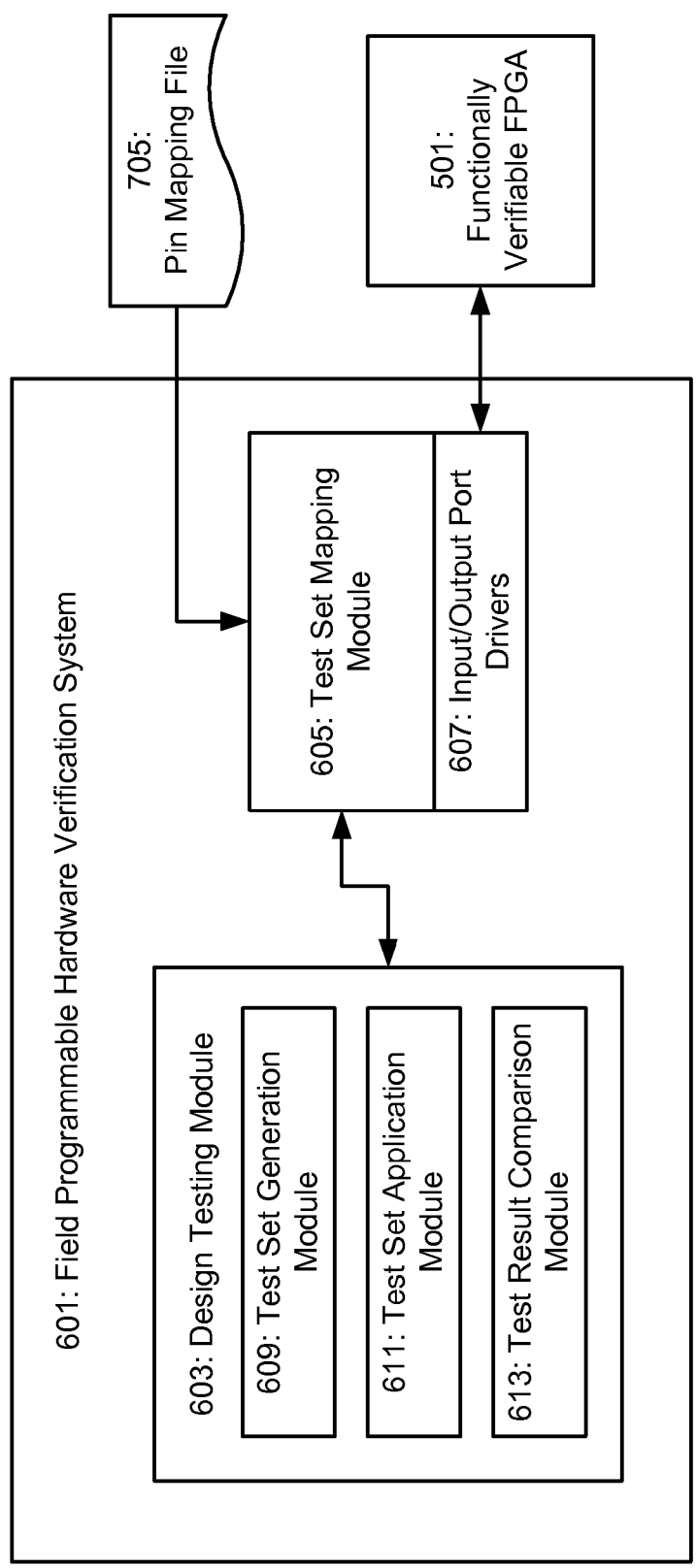
FIG. 6 illustrates a system for performing functional verification of a programmed field programmable gate array according to various implementations of the present invention.
Figure 7:
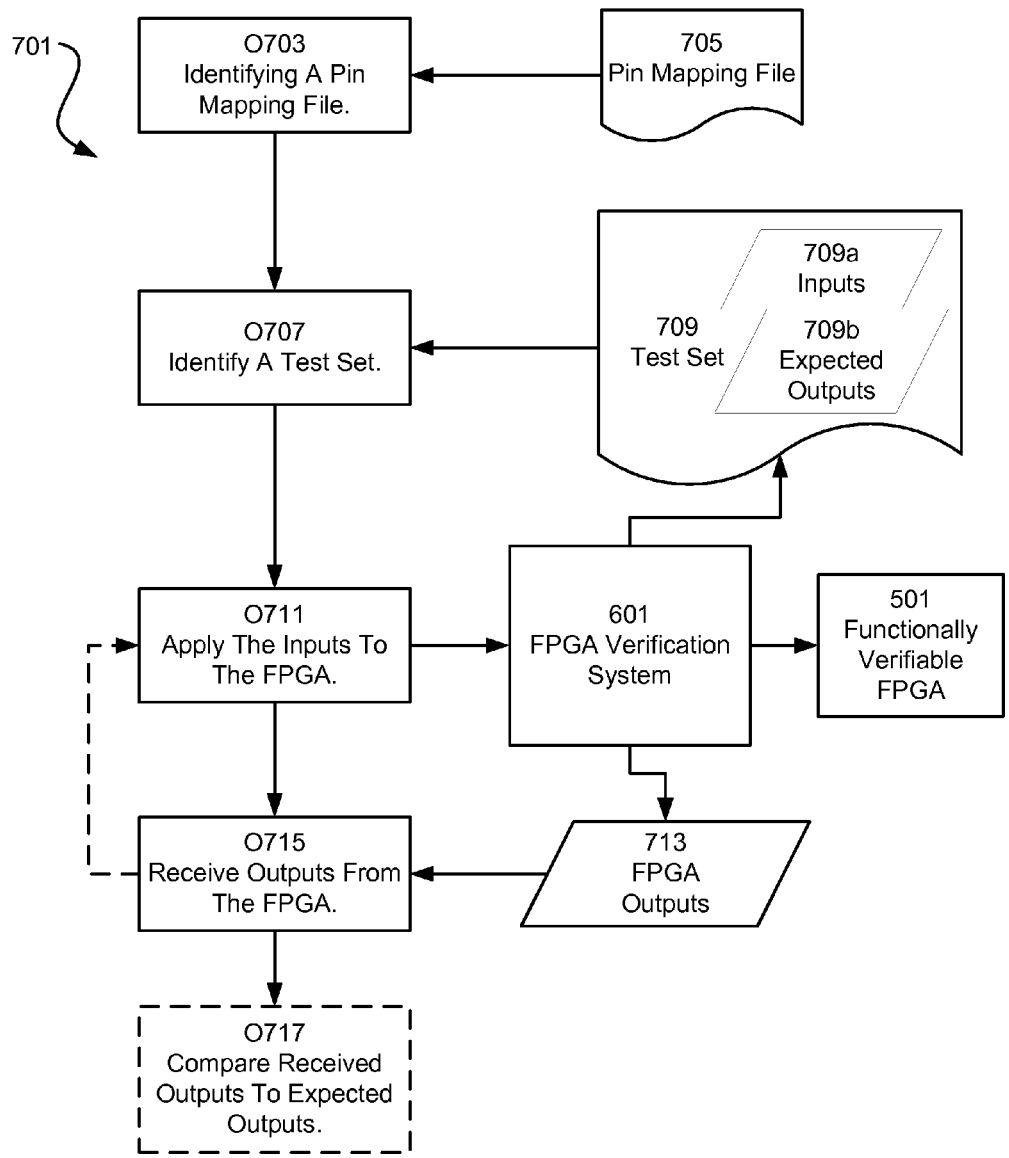
FIG. 7 illustrates a method of performing functional verification of a programmed field programmable gate array according to various implementations of the present invention.

FIG. 5 illustrates a functionally verifiable field programmable gate array 501 that may be provided by various implementations of the present invention, while FIG. 6 illustrates a functionally verifiable field programmable gate array verification system 601 that may also be provided by various implementations of the present invention. FIG. 7 then illustrates a method of functionally verifying a field programmable gate array 701 that may also be provided by various implementations of the present invention. Reference to FIGS. 5, 6, and 7 will be made below in discussing various illustrative examples of the present invention.

As can be seen from FIG. 5, the functionally verifiable field programmable gate array 501 includes logic blocks 203, routing channels 205, switch blocks 207, a functional verification module 503, which has a combination input and output port ("input/output port") 505, and input/output pins 507. In various implementations, the input/output port 505 may be a universal serial bus (USB) port. Alternatively, the input/output port 505 may be a joint test action group (JTAG) compatible port. In some implementations, the input/output port 505 may be a serial interface port, such as, for example an inter-integrated (12C) port. The input/output port 505 facilitates functional verification of the functionally verifiable field programmable gate array 501 after it has been programmed. The input/output port 505 may connect to a hardware verification tool operating on a computing platform, such as, the computing device 101 of FIG. 1.

The field programmable hardware verification system 601 (referred to herein as the "tool" for convenience) shown in FIG. 6 includes a design testing module 603, a test set mapping module 605, and an input/output port driver 607. In various implementations, the tool 601 may be electrically connected to the functionally verifiable field programmable gate array 501 as shown. Electrically connecting the tool 601 and the functionally verifiable field programmable gate array 501 may be facilitated through the input/output port drivers 607 and the input/output port 505. For example, if the input/output port 505 were a Universal Serial Bus (USB) port, then the input/output port drivers 607 would be USB compatible drivers accessible by the tool 601. As a result, the tool 601 and the functionally verifiable field programmable gate array 501 would be electrical connected and the transmission of data between the tool 601 and the functionally verifiable field programmable gate array 501 would be enabled.

The design testing module 603, as can be seen, includes a test set generation module 609, a test set application module 611, and a test result comparison module 613. In some implementations, the design testing module 603 may be implemented as computational instructions (i.e. software), executable on a general purpose computing device, such as, for example, the computing device 101 of FIG. 1. In other implementations, the design testing module 603 may be implemented by analog electrical components (i.e. analog hardware), digital electrical components (i.e. digital hardware), or some combination of both, arranged to achieve the detailed requisite functionality. With further implementations, the design testing module 603 may be implemented as a combination between software and hardware.

With some implementations, the design testing module 603 may be implemented in part by a design verification software toolset, such as, for example, the Questa toolset available from Mentor Graphics Corporation of Wilsonville Oreg. The design testing module 603 may be incorporated into the tool 601 (as shown) or the module 603 may work in conjunction with, but be separate from, the tool 601.

The method 701 includes an operation 703 for identifying a pin mapping file 705. Details regarding the pin mapping file 705 will be discussed in greater detail below. The method 701 additionally includes an operation 707 for identifying a test set 709. As can be seen, the test set 709 includes a set of inputs 709a and a set of corresponding expected outputs 709b. In various implementations, the test set generation module 609 is configured to generate the test set 709, which may subsequently be used for testing the functionality of the functionally verifiable field programmable gate array 501. In other implementations, the test set generation module 609 is configured to receive a test set provided by a user of the tool 601. In still other implementations, the test set generation module 609 may be configured to both generate and receive a test set.

With various implementations, the test set generated, or alternatively received, by the test set generation module 609 is the same test set used to functionally verify the logical design corresponding to the functionally verifiable field programmable gate array 501. More particularly, the test set 709 has the same set of inputs and corresponding expected outputs as does the test set 405 discussed in conjunction with FIG. 4 above.

By using the same test set to functionally verify the logical design and any functionally verifiable field programmable gate array 501 programmed based upon the logical design, the results from both functional verification tests can be compared. Accordingly, the accuracy of the tools used to design and program the device, such as, for example, the tools used to synthesize the programmable design 309 and the tools used to program the functionally verifiable field programmable gate array 501, may be assured. As indicated above, double checking the accuracy of the tools used to design and program the device is a requirement of the DO-254 standard.

The method 701 further includes an operation 711 for applying the inputs 709a to the functionally verifiable field programmable gate array 501. As will be explained in greater detail below, the inputs 709a include both input values to be applied and input pins where the values are to be applied. As can be seen, the operation 711 utilizes the tool 601 to apply the inputs 709a to the functionally verifiable field programmable gate array 501. Specifically, the test set application module 611 is configured to apply the test set to the functionally verifiable field programmable gate array 501. In some implementations, the test set application module 611 will send the inputs 709a to the functional verification module 503 via the input/output port 505. As can be seen, the test set application module 611 routes the inputs through a test set mapping module 605, which subsequently utilizes the input/output port drivers 607 to communicate with the input/output port 505.

As those of skill in the art will appreciate, an input for functionally verifying a logical design, such as, for example, an input from the set of inputs 405a, will detail the input signal itself and a signal name from the logical design to receive the signal. For example, an illustrative input may detail a digital signal having the binary value of '1' and specify that the signal be applied to the input/output signal having the name "Servo_Enable" in the logical design. Conversely, the corresponding expected output will detail an expected digital signal and specify which input/output the signal should be readable from. As those of skill in the art will further appreciate, when a field programmable gate array is programmed, the various input/output signals referenced within the logical design will correspond to input/output pins within the field programmable gate array. More particularly, the example signal above (i.e. Servo_Enable) will ultimately become one of the input/output pins 507 within the field programmable gate array 501. The pin mapping file 705, introduced above, details which pins 507 within the functionally verifiable field programmable gate array 501 correspond to which input/output signals within the logical design 305.

As indicated previously, in various implementations, the test set 709 is the same test set used to functionally verify the logical design. Accordingly, the input/output signals referenced within the test set 709 will refer to input/output signal names within the logical design. The test set mapping module 605 will map the input/output signal names to their corresponding input/output pins 507. As such, the functional verification module 503 will receive a test input and corresponding input/output pin to apply the test input to. Subsequently, the functional verification module 503 will enable a "clock cycle" on the functionally verifiable field programmable gate array 501. This is discussed in greater detail below. As a result of enabling a clock cycle, the functionally verifiable field programmable gate array 501 will "respond" to the input stimulus. More specifically, as those of skill in the art will appreciate, the logic blocks 203 will change states accordingly. Then, as shown, the method 501 includes an operation 715 for receiving outputs 713 from the functionally verifiable field programmable gate array 501.

Receiving outputs from the functionally verifiable field programmable gate array 501 (i.e. the operation 715) is, essentially, the reverse of the operation 711. Specifically, the response to the applied inputs is identified by the functional verification module 503 and then transferred to the test set mapping module 605 which matches the input/output pins 507 where the response was recorded to the corresponding input/output signal names in the pin mapping file 705. Subsequently, the expected outputs 709b and the received outputs 713 may be compared, as provided by an operation 717.

As can be seen from this figure, the operations 711 and 715 may be repeated a number of times. More specifically, an input 709a may be applied to the functionally verifiable field programmable gate array 501, the device 501 allowed to process a clock cycle, and the outputs 713 received. Each repetition of the operation 711 and the operation 715 is referred to herein as an "iteration" of the operations for convenience. In some implementations, the tool 601 controls the clock speed. More particularly, how often an iteration of the operations 711 and 715 occur will be controlled by tool 601, through the functional verification module 503. The functional verification module 503 may include a clocking component 509, configured to control how often the logic blocks 203 within the functionally verifiable field programmable gate array 501 process inputs. In various implementations, the clocking component 509 is comprised of Joint Test Action Group test clock functions. In some implementations, the clocking component 509 is an actual clock. In still some implementations, the clock component 509 is configured to receive an externally generated clock signal through the input/output port 505.

With various implementations, the functional verification module 503 also includes a memory component 511. The memory component 511 may be configured to receive, and non-transitorily store, the inputs 709a and the responses 713. Subsequently, the inputs 709a may be applied to the appropriate input/output ports 507 and the responses 713 received from the input/output ports 507 "at speed." More specifically, the inputs 709a will be applied to the input/output pins 507 and outputs received from the input/output pins 507 in between clock cycles controlled by the default clock within the functionally verifiable field programmable gate array 501. As those of skill in the art will appreciate, although this is referred to as "at speed," an iteration of the operations 711 and 715 may actually be slower than the true operating speed with which the device 501 might operate under normal conditions.

In some implementations, the inputs 709a are applied to the input/output pins 507 by configuring the switch blocks 207, as detailed above. This requires a routing channel 205 between the input/output pins 507. Additionally, corresponding switch blocks 207 are needed at the various junctions between the routing channels 205 and the input/output pins 507 such that electrical connection between the input/output pins 507 and the functional verification module 503 can be made during iterations of the operations 711 and 715. Accordingly, during a particular iteration, the switch blocks 207 may be reconfigured to enable the appropriate electrical connection corresponding to the input 709a applied during that iteration.

With some implementations, the inputs 709a are applied to the input/output pins 507 through a scan-chain, such as for example, Joint Test Action Group compatible scan-chain logic. More particularly, a scan chain may be provided between the inputs and outputs to the logic blocks 203 and the functional verification module 503. Then, during an iteration of the operations 711 and 715, the input 709a may be loaded onto the scan chain and applied to the appropriate input/output pins 507 accordingly. Similarly, the outputs may be received from the input/output pins 507 by a scan chain.

In some implementations, the functional verification module 503 may isolate the input/output pins 507 from any external electrical connections prior to applying the inputs to the functionally verifiable field programmable gate array 501. This may be facilitated by configuring the switch blocks 207. Alternatively, input/output buffers within the device may be configured to isolate the input/output pins 507 from external stimulus. In various implementations, isolation may be facilitated through Joint Test Action Group (JTAG) boundary scan functions.

With various implementations, the functional verification module 503 may include a master disable state. This may be facilitated by requiring that power be applied through the input/output port 505 in order for the functional verification module 503 to be active. In other implementations, this may be facilitated by including a switch block 207 which may be configured to isolate the functional verification module 503 from the input/output pins 507.

As can be seen from FIG. 7, the method 701 may also include an operation for comparing the received outputs 713 to the expected outputs 709b. In various implementations, this may include providing a listing of which inputs 709a resulting in a discrepancy between the outputs to a user of the tool 601. In some implementations, this listing may be graphical. In still other implementations, this listing may be textual.

Conclusion

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method for performing verification of an integrated circuit, the method comprising:
   identifying an integrated circuit, the integrated circuit including a plurality of input/output pins and a verification component;
   identifying a verification test, the verification test defining a signal and at least one of the plurality of input/output pins;
   sending the verification test to the verification component;
   causing the verification component to load the verification test onto the at least one of the plurality of input/output pins;
   causing the integrated circuit to process at least one clock cycle;
   causing the verification component to capture the states of the plurality of input/output pins;
   receiving the states of the plurality of input/output pins.

2. A computer-implemented method for performing verification of a programmable integrated circuit, the method comprising:
   identifying a programmable integrated circuit, the programmable integrated circuit including a plurality of input/output pins and a verification component;
   identifying a verification test;
   sending the verification test to the verification component;
   causing the verification component to load the verification test onto the at least one of the plurality of input/output pins;
   causing the programmable integrated circuit to process at least one clock cycle;
   causing the verification component to capture the states of the plurality of input/output pins; and
   receiving the states of the plurality of input/output pins from the verification component.

3. The computer-implemented method recited in claim 2, the verification test includes at least one verification test set, each at least one verification test set having:
   one or more input signal names;
   one or more input signal states corresponding to the one or more input signal names;
   one or more output signal names;
   one or more expected output signal states corresponding to the one or more output signal names; and
   wherein the method act for causing the verification component to load the verification test onto the at least one of the plurality of input/output pins comprises:
      identifying the one or more input/output pins that correspond to the one or more input signal names; and
      applying the one or more input signal states to the one or more input/output pins corresponding to the one or more input signal names.

4. The computer-implemented method recited in claim 3, the method act for applying the one or more input signal states to the one or more input/output pins corresponding to the one or more input signal names comprising:
   configuring the programmable integrated circuit such that electrical connection between the identified input/output pins and the verification component is made; and
   applying a digital signal corresponding to the one or more input signal states onto the one or more identified input/output pins.

5. The computer-implemented method recited in claim 3, the method act for causing the verification component to capture the states of the plurality of input/output pins comprising:
   identifying the one or more input/output pins that correspond to the one or more output signal names;
   configuring the programmable integrated circuit such that electrical connection between the identified input/output pins and the verification component is made; and
   identifying the state of one or more identified input/output pins after the programmable integrated circuit has processed the at least one clock cycle.

6. The computer-implemented method recited in claim 3, the verification test including a plurality of verification test sets, the method further comprising repeating the following method acts:
   causing the verification component to load the verification test onto the at least one of the plurality of input/output pins;
   causing the integrated circuit to process at least one clock cycle;
   causing the verification component to capture the states of the plurality of input/output pins; and
   wherein a different verification test set is loaded onto the at least one of the plurality of input/output pins during each repetition.

7. The computer-implemented method recited in claim 3, the method further comprising comparing the one or more expected output signal states to the states of the captured states.

8. The computer-implemented method recited in claim 2, further comprising causing the input/output pins to be electrically disconnected from signals external to the programmable integrated circuit.

9. One or more non-transitory computer-readable media, having computer executable instructions for performing verification of a programmable integrated circuit stored thereon, the computer executable instructions comprising:
   causing a computer to perform a set of operations; and
   wherein the set of operations include:
      identifying a programmable integrated circuit, the programmable integrated circuit including a plurality of input/output pins and a verification component;
      identifying a verification test;
      sending the verification test to the verification component;
      causing the verification component to load the verification test onto the at least one of the plurality of input/output pins;
      causing the programmable integrated circuit to process at least one clock cycle;
      causing the verification component to capture the states of the plurality of input/output pins; and
      receiving the states of the plurality of input/output pins from the verification component.

10. The one or more non-transitory computer-readable media recited in claim 9, the verification test includes at least one verification test set, each at least one verification test set having:
    one or more input signal names;
    one or more input signal states corresponding to the one or more input signal names;
    one or more output signal names;
    one or more expected output signal states corresponding to the one or more output signal names; and
    wherein the operation for causing the verification component to load the verification test onto the at least one of the plurality of input/output pins comprises:
       identifying the one or more input/output pins that correspond to the one or more input signal names; and applying the one or more input signal states to the one or more input/output pins corresponding to the one or more input signal names.

11. The one or more non-transitory computer-readable media recited in claim 10, the operation for applying the one or more input signal states to the one or more input/output pins corresponding to the one or more input signal names comprising:
  configuring the programmable integrated circuit such that electrical connection between the identified input/output pins and the verification component is made; and
  applying a digital signal corresponding to the one or more input signal states onto the one or more identified input/output pins.

12. The one or more non-transitory computer-readable media recited in claim 10, the operation for causing the verification component to capture the states of the plurality of input/output pins comprising:
  identifying the one or more input/output pins that correspond to the one or more output signal names;
  configuring the programmable integrated circuit such that electrical connection between the identified input/output pins and the verification component is made; and
  identifying the state of one or more identified input/output pins after the programmable integrated circuit has processed the at least one clock cycle.

13. The one or more non-transitory computer-readable media recited in claim 10, the verification test including a plurality of verification test sets, the set of operations further comprising repeating the following operations:
  causing the verification component to load the verification test onto the at least one of the plurality of input/output pins;
  causing the integrated circuit to process at least one clock cycle;
  causing the verification component to capture the states of the plurality of input/output pins; and
  wherein a different verification test set is loaded onto the at least one of the plurality of input/output pins during each repetition.

14. The one or more non-transitory computer-readable media recited in claim 10, the set of operations further comprising comparing the one or more expected output signal states to the captured states.

15. The one or more non-transitory computer-readable media recited in claim 10, the set of operations further comprising:
  causing the input/output pins to be electrically disconnected from signals external to the programmable integrated circuit.

16. An apparatus for verifying a programmable integrated circuit comprising:
  an input/output port driver module configured to connect to a programmable integrated circuit, the programmable integrated circuit having a plurality of input/output pins and a verification component;
  a test set generation module configured to receive a verification test set, the verification test set including:
    one or more input signal names;
    one or more input signal states corresponding to the one or more input signal names;
    one or more output signal names; and
      one or more expected output signal states corresponding to the one or more output signal names;
  a test set mapping module configured to receive a pin mapping and then identify one or more of the input/output pins corresponding to a one of the signal names; and
  a test set application module configured to:
    send the verification test to the verification component;
    causes the verification component to load the verification test onto the at least one of the plurality of input/output pins;
    cause the programmable integrated circuit to process at least one clock cycle;
    cause the verification component to capture the states of the plurality of input/output pins; and
    receive the captured states from the verification component.

17. The apparatus recited in claim 16, further comprising a result comparison module configured to compare the one or more expected output signal states to the captured states.

* * * * *